United States Patent [19]

Sasaki et al.

[11] Patent Number: 4,833,395
[45] Date of Patent: May 23, 1989

[54] SEMICONDUCTOR DEVICE HAVING A TEST CIRCUIT

[75] Inventors: Takeshi Sasaki; Hideo Monma, both of Kawasaki, Japan

[73] Assignee: Fujitsu Limited, Kanagawa, Japan

[21] Appl. No.: 111,741

[22] Filed: Oct. 23, 1987

[51] Int. Cl.[4] .............................................. G01R 31/28
[52] U.S. Cl. .................................... 324/73 R; 371/15
[58] Field of Search .......................... 324/73 R, 158 R; 371/15, 16

[56] References Cited

U.S. PATENT DOCUMENTS 4,465,971 8/1984 Abeyta ........................... 324/158 R
4,697,140 9/1987 Saito et al. ......................... 324/73 R

FOREIGN PATENT DOCUMENTS 0141681 5/1985 European Pat. Off. .
2305098 10/1976 France .
2393426 12/1978 France .

84/02580 7/1984 PCT Int'l Appl. .

Primary Examiner—Ernest F. Karlsen
Attorney, Agent, or Firm—Armstrong, Nikaido, Marmelstein, Kubovcik & Murray

[57] ABSTRACT

A semiconductor device comprises a test signal generating circuit for generating a test signal having an arbitrary frequency, a first buffer for selectively outputting one of the test signal and an external input signal, at least one test circuit supplied with an output signal of the first buffer, an external output terminal, a logic circuit, a second buffer for selectively supplying to the external terminal one of the test signal from the test circuit and an output signal of the logic circuit, and a switching signal generating circuit for generating switching signals for the first and second buffers. The state of the test circuit is checked by use of the test signal to indirectly determine the state of the logic circuit.

7 Claims, 3 Drawing Sheets

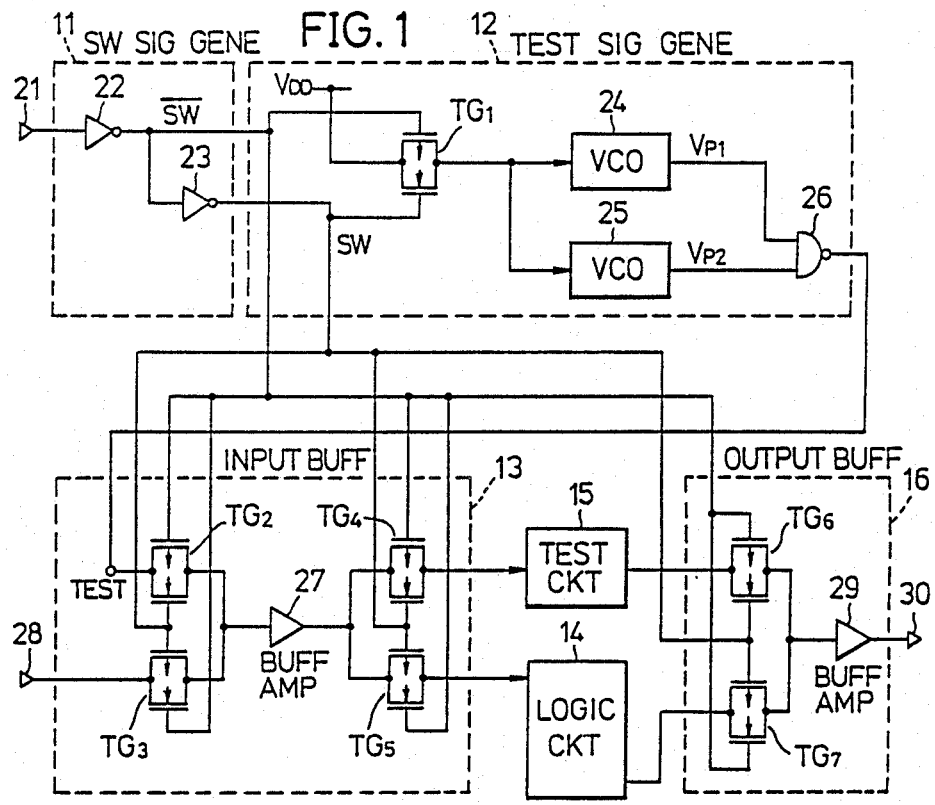
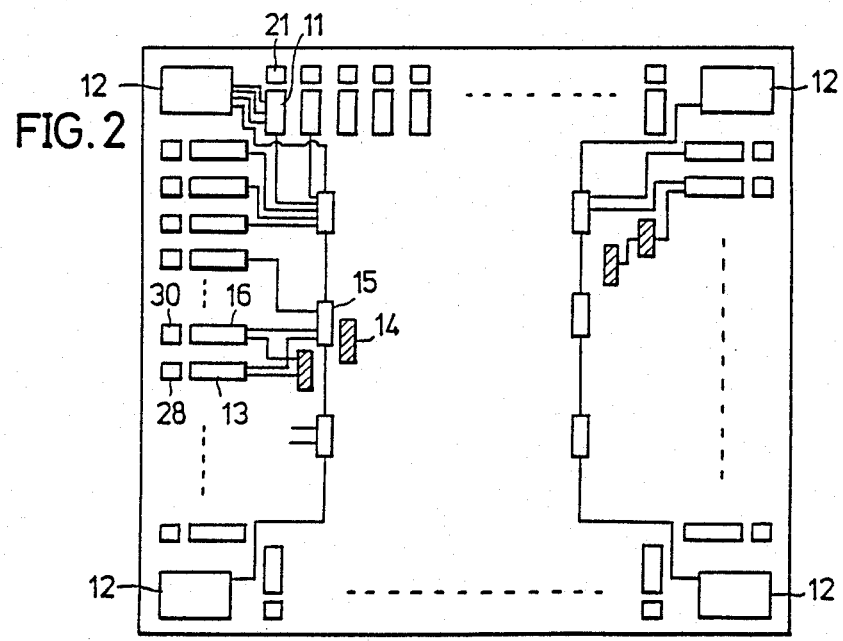

SEMICONDUCTOR DEVICE HAVING A TEST CIRCUIT

BACKGROUND OF THE INVENTION

The present invention generally relates to semiconductor devices, and more particularly to a semiconductor device having a test circuit.

In the production process of a large scale integrated circuit (LSI), defects are inevitably introduced. For this reason, it is necessary to carry out a test so as to check whether or not the produced LSI is as originally designed.

The test times for the LSI can roughly be divided into test items belonging to a D.C. characteristic test and test items belonging to an A.C. characteristic test. The D.C. characteristic test is carried out to test the static characteristic of the LSI, and is used to test input and output buffers of the LSI which function as interface circuits for providing an interface between a logic circuit within the LSI and an external circuit or device to the LSI. For example, the D.C. characteristic test checks whether or not a rated current flows through the input and output buffers and whether or not a rated voltage is obtained at the input and output buffers. On the other hand, the A.C. characteristic test is carried out to test the dynamic characteristic of the LSI, and is used to test the total operation of the LSI including the input and output buffers and the logic circuit of the LSI. For example, the A.C. characteristic test checks the functions of the logic circuit, that is whether or not a predetermined operation is carried out in the logic circuit, and the operation speed of the logic circuit. Presently, the test data used for carrying out these tests are made by the user in the case of a semi-customized LSI, since the logic operation of the logic circuit within the LSI is unknown to the actual manufacturer of the LSI.

Recently, the integration density of the LSI is becoming higher and higher and the logic operation of the logic circuit within the LSI is becoming more complex. As a result, there is a problem in that the process of making the test data is becoming more complex and troublesome due to the complexity of the logic circuit. Furthermore, the logic operation of the logic circuit within the LSI is different among different LSIs, and there is a problem in that different test data must be made for the different LSIs.

SUMMARY OF THE INVENTION

Accordingly, it is a general object of the present invention to provide a novel and useful semiconductor device having a test circuit, in which the problems described heretofore are eliminated.

Another and more specific object of the present invention is to provide a semiconductor device comprising a test signal generating circuit for generating a test signal having an arbitrary frequency, a first buffer for selectively outputting one of the test signal and an external input signal, at least one test circuit supplied with an output signal of the first buffer, an external output terminal, a logic circuit, a second buffer for selectively supplying to the external terminal one of the test signal from the test circuit and an output signal of the logic circuit, and a switching signal generating circuit for generating switching signals for the first and second buffers. According to the semiconductor device of the present invention, the D.C. characteristic test can be carried out by use of the test signal generated in the test signal generating circuit, and it is possible to reduce the burden on the user who had to conventionally make the test data. In addition, by checking the test signal obtained from the external output terminal, it is possible to detect defects in the internal circuit of the semiconductor device caused by inconsistencies introduced during the production process. Moreover, it is possible to indirectly detect defects in the logic circuit by testing the test circuit which is located in a vicinity of the logic circuit. Furthermore, because the test can be carried out independently of the circuit construction of the logic circuit, it is possible to standardize the test regardless of the different logic circuits, and accordingly, regardless of the different semiconductor devices.

Other objects and further features of the present invention will be apparent from the following detailed description when read in conjunction with the accompanying drawings.

BRIEF DESCRIPTION OF THE DRAWINGS

FIG. 1 is a system circuit diagram showing an essential part of a first embodiment of the semiconductor device having a test circuit according to the present invention;

FIG. 2 is a plan view generally showing an embodiment of a layout of circuits in the semiconductor device applied with the present invention;

DETAILED DESCRIPTION

Figure 3:
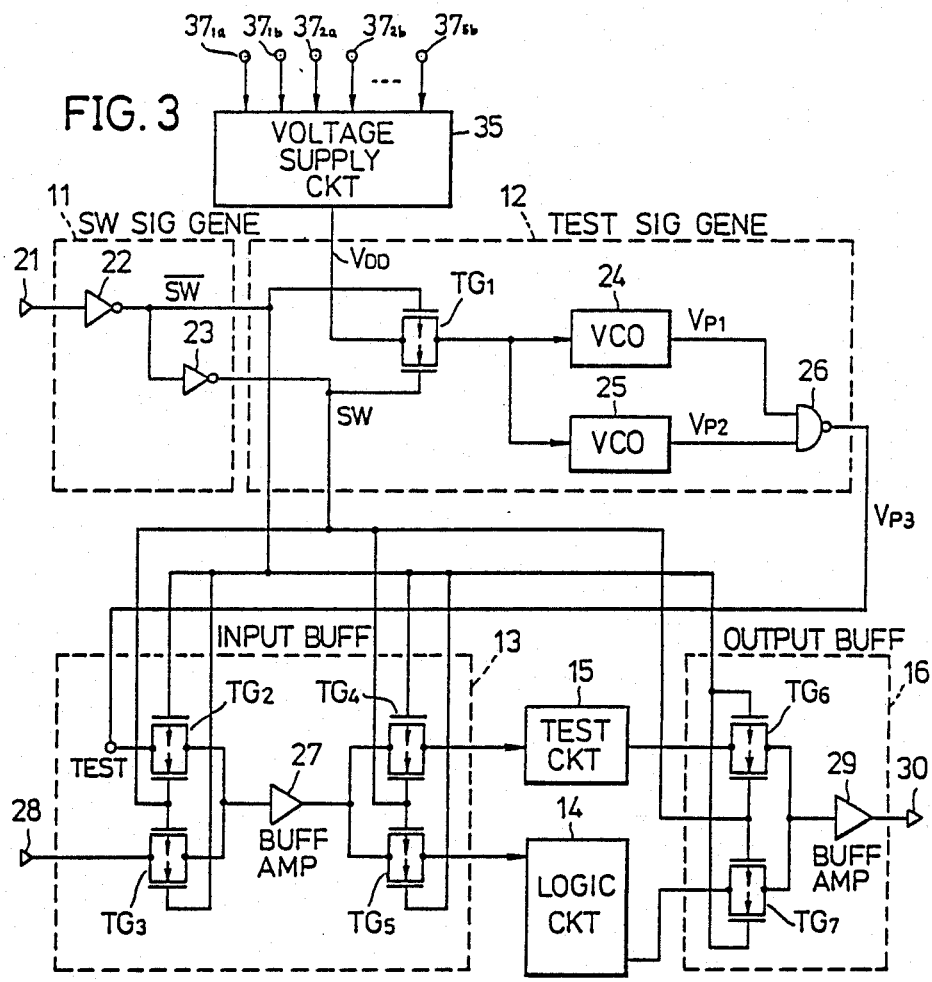
FIG. 3 is a system circuit diagram showing an essential part of a second embodiment of the semiconductor device having a test circuit according to the present invention.

FIG. 1 shows an essential part of a first embodiment of the semiconductor device having a test circuit according to the present invention. In the present embodiment, the semiconductor device is an LSI comprising a switching signal generating circuit 11, a test signal generating circuit 12, an input buffer 13, a logic circuit 14, a test circuit 15, and an output buffer 16. The test circuit 15 is located in a vicinity of the logic circuit 14.

When carrying out a test operation of the LSI, a high-level signal is applied to a test external terminal 21 and is supplied to the switching signal generating circuit 11. On the other hand, a low-level signal is applied to the test external terminal 21 and is supplied to the switching signal generating circuit 11 when the LSI is to carry out a normal operation. The switching signal generating circuit 11 comprises inverters 22 and 23.

The test signal generating circuit 12 comprises a transmission gate $TG_1$, voltage controlled oscillators (VCOs) 24 and 25, and a 2-input NAND circuit 26. The VCOs 24 and 25 have mutually different input control voltage versus output oscillation frequency characteristics so that an output pulse signal $V_{p1}$ of the VCO 24 has a period longer than that of an output pulse signal $V_{p2}$ of the VCO 25 with respect to a control voltage $V_{DD}$.

The input buffer 13 comprises a buffer amplifier 27, a pair of transmission gates TG$_2$ and TG$_3$ provided in parallel at an input stage of the buffer amplifier 27, and a pair of transmission gates TG$_4$ and TG$_5$ provided in parallel at an output stage of the buffer amplifier 27. An input of the transmission gate TG$_3$ is connected to an external input terminal 28. An output of the transmission gate TG$_4$ is connected to an input of the test circuit 15, and an output of the transmission gate TG$_5$ is connected to an input of the logic circuit 14.

The output buffer 16 comprises a buffer amplifier 29 and a pair of transmission gates TG$_6$ and TG$_7$ connected to an input stage of the buffer amplifier 29. An output of the test circuit 15 is connected to an input of the transmission gate TG$_6$, and an output of the logic circuit 14 is connected to an input of the transmission gate TG$_7$. An output of the buffer amplifier 29 is connected to an external output terminal 30.

The transmission gates TG$_1$ through TG$_7$ are switched and controlled responsive to switching signals SW and $\overline{SW}$ generated from the switching signal generating circuit 11.

Next, a description will be given on the operation of the LSI shown in FIG. 1 during the test operation. During the test operation, a high-level signal applied to the test external terminal 21 is inverted into a low-level switching signal $\overline{SW}$ in the inverter 22 of the switching signal generating circuit 11, and is further inverted into a high-level switching signal $\overline{SW}$ in the inverter 23 of the switching signal generating circuit 11.

The switching signals SW and $\overline{SW}$ are supplied to the transmission gate TG$_1$ of the test signal generating circuit 12 and turns the transmission gate TG$_1$ ON. In addition, the switching signals SW and $\overline{SW}$ are also supplied to the transmission gates TG$_2$, TG$_3$, TG$_4$ and TG$_5$ of the input buffer 13. Hence, the transmission gates TG$_2$ and TG$_4$ of the input buffer 13 are turned ON, while the transmission gates TG$_3$ and TG$_5$ of the input buffer 13 are turned OFF. The switching signals SW and $\overline{SW}$ are further supplied to the transmission gates TG$_6$ and TG$_7$ of the output buffer 16, and the transmission gate TG$_6$ is turned ON while the transmission gate TG$_7$ is turned OFF.

Accordingly, the control voltage V$_{DD}$ is passed through the transmission gate TG$_1$ and is supplied to the VCOs 24 and 25 and variably controls the repetition frequencies (oscillation frequencies) of the output pulse signals V$_{p1}$ and V$_{p2}$. The output pulse signals V$_{p1}$ and V$_{p2}$ of the VCOs 24 and 25 are supplied to the NAND circuit 26 wherein a NAND operation is carried out on the two pulse signals V$_{p1}$ and V$_{p2}$.

An output signal of the NAND circuit 26 is outputted as an output test signal of the test signal generating circuit 12, and is passed through the ON transmission gate TG$_2$ of the input buffer 13. The test signal passed through the transmission gate TG$_2$ is subjected to a buffer amplification in the buffer amplifier 27 and is supplied to the test circuit 15 through the ON transmission gate TG$_4$. Since the other transmission gates TG$_3$ and TG$_5$ of the input buffer 13 are OFF as described before, an external signal applied to the external input terminal 28 is prevented from being supplied to the buffer amplifier 27, and furthermore, the output test signal of the buffer amplifier 27 is prevented from being supplied to the logic circuit 14.

The test circuit 15 comprises a transistor cell or the like, and is located in a vicinity of the logic circuit 14. Hence, it is possible to indirectly detect defects in the logic circuit 14 introduced during the production process by testing the test circuit 15, without testing the logic circuit 14 directly. Defects in the gate withstand voltage, contacts of the aluminum conductor and the like introduced during the production process usually exist throughout the entire wafer or concentrate on a portion of the wafer. It is for this reason that the state of the logic circuit 14 can be guessed to a certain extent by testing the test circuit 15 which is located in the vicinity of the logic circuit 14.

The test signal obtained from the test circuit 15 is passed through the ON transmission gate TG$_6$ and the buffer amplifier 29 of the output buffer 16, and is supplied to the external output terminal 30. A signal pattern of a signal obtained from the external output terminal 30 is registered as a test pattern and is tested on an LSI tester (not shown). During the test operation, the transmission gate TG$_7$ of the output buffer 16 is OFF as described before. Thus, a signal obtained from the logic circuit 14 is prevented from being supplied to the buffer amplifier 29 of the output buffer 16.

According to the present embodiment, it is possible to carry out the D.C. characteristic test on the buffer amplifiers 27 and 29 by use of the test signal. In addition, the defects caused by inconsistencies generated during the production process directly affect the input control voltage versus output oscillation frequency characteristics of the VCOs 24 and 25. For this reason, depending on the inconsistencies generated during the production process, the desired test signal may not be obtained from the test signal generating circuit 15. In this case, the desired signal is also not obtainable from the external output terminal 30, and it is therefore possible to detect the defects and it is useful in evaluating the operation speed of the LSI.

Next, a description will be given on the normal operation of the LSI when the logic circuit 14 is selected. In this case, a low-level signal is applied to the test external terminal 21. Hence, a high-level switching signal $\overline{SW}$ and a low-level switching signal SW are obtained from the switching signal generating circuit 11. As a result, the transmission gates TG$_1$, TG$_2$, TG$_4$ and TG$_6$ are turned OFF, while the transmission gates TG$_3$, TG$_5$ and TG$_7$ are turned ON.

Accordingly, only the external input signal from the external input terminal 28 is supplied to the buffer amplifier 27 of the input buffer 13 through the ON transmission gate TG$_3$. The external input signal obtained from the buffer amplifier 27 is not supplied to the test circuit 15, because the transmission gate TG$_4$ is OFF. Thus, the external input signal obtained from the buffer amplifier 27 is supplied only to the logic circuit 14 through the ON transmission gate TG$_5$.

A signal obtained from the logic circuit 14 is passed through the ON transmission gate TG$_7$ and the buffer amplifier 29 of the output buffer 16, and is supplied to the external output terminal 30.

Therefore, during the normal operation of the LSI when no test is carried out, the output signal of the input buffer 13 is switched from the test signal to the external input signal from the external input terminal 28 by applying the low-level signal to the test external terminal 21, and the logic circuit 14 is operated by the external input signal. In addition, the input signal of the output buffer 16 is switched from the output signal of the test circuit 15 to the output signal of the logic circuit 14, and the output signal of the logic circuit 14 is obtained from the external output terminal 30 through the ON transmission gate TG7 and the buffer amplifier 29 of the output buffer 16.

The conventional A.C. characteristic test which is carried out on the logic circuit is complex in that the setting of the input and the discrimination of the output are complex and the test pattern is different for the different LSIs. However, according to the present embodiment, the test can be standardized for the different LSIs by use of a predetermined test signal which is used to test the test circuit 15 and accordingly check the state of the logic circuit 14 indirectly.

FIG. 2 is a plan view generally showing an embodiment of a layout of circuits in the LSI. In FIG. 2, those parts which are the same as those corresponding parts in FIG. 1 are designated by the same reference numerals, and a description thereof will be omitted. As may be seen from FIG. 2, there are a plurality of circuit parts corresponding to the circuits shown in FIG. 1, and the test circuit 15 is provided in the vicinity of the logic circuit 14 which needs to be tested. In the present embodiment, the test signal generating circuit 12 is located at unused corner portions of the LSI.

Next, a description will be given on a second embodiment of the semiconductor device having a test circuit according to the present invention, by referring to FIG. 3. In FIG. 3, those parts which are the same as those corresponding parts in FIG. 1 are designated by the same reference numerals, and a description thereof will be omitted.

When the control voltage $V_{DD}$ is varied, the output oscillation frequencies of the VCOs 24 and 25 change accordingly. However, since the input control voltage versus output oscillation frequency characteristics of the VCOs 24 and 25 are mutually different as described before, the rate of change of the output oscillation frequency of the VCOs 24 and 25 is different between the two. Accordingly, the period and the like of the test signal produced from the NAND circuit 26 change by variably controlling the control voltage $V_{DD}$. The present embodiment is especially suited for a case where the operation speed of the circuit within the LSI is to be tested, since the frequency of the test signal is variable.

Figure 4:
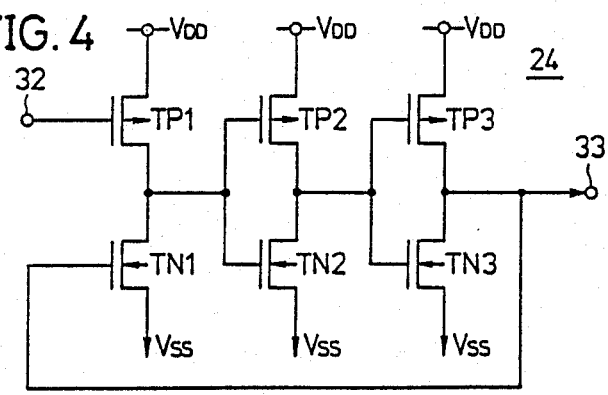
FIG. 4 is a circuit diagram showing an embodiment of a voltage controlled oscillator in the circuit system shown in FIG. 1.

FIG. 4 shows an embodiment of the VCO 24. Since the circuit construction of the VCO 25 may be identical to that of the VCO 24, a description on the circuit construction of the VCO 25 will be omitted. In FIG. 4, the VCO 24 comprises a P-channel transistor TP1 and an N-channel transistor TN1 connected in parallel between the control voltage $V_{DD}$ and a voltage $V_{SS}$, a P-channel transistor TP2 and an N-channel transistor TN2 connected in parallel between the control voltage $V_{DD}$ and the voltage $V_{SS}$, and a a P-channel transistor TP3 and an N-channel transistor TN3 connected in parallel between the control voltage $V_{DD}$ and the voltage $V_{SS}$. A node between the transistors TP1 and TN1 is connected to bases of the transistors TP2 and TN2, and an node between the transistors TP2 and TN2 is connected to bases of the transistors TP3 and TN3. An input voltage to the VCO 24 is supplied to a base of the transistor TP1 through a terminal 32, and an output voltage of the VCO 24 is obtained from a node between the transistors TP3 and TN3 and is outputted through a terminal 33. This output voltage of the VCO 24 is fed back to a base of the transistor TN1. Therefore, the ON resistance of the transistor TP1 changes when the input voltage to the VCO 24 is varied, and the output oscillation frequency of the VCO 24 changes accordingly.

Figure 6:
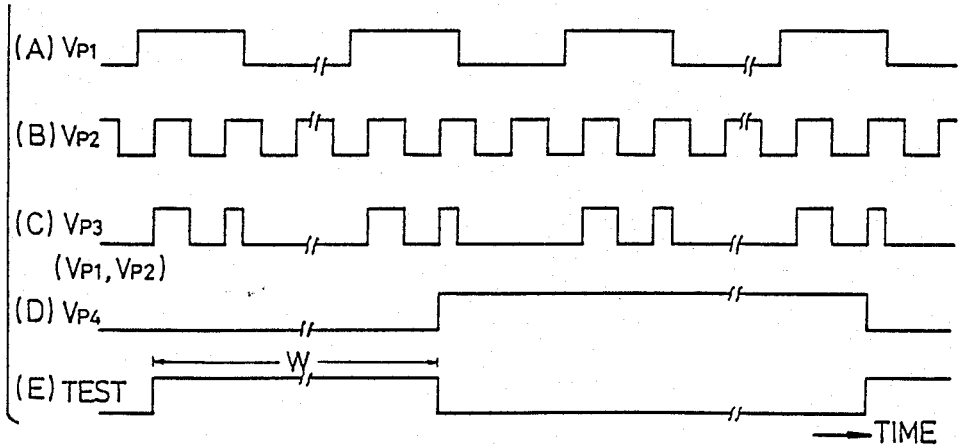
FIG. 6 (parts A-E) are timing charts for explaining the operation of a test signal generating circuit.

Accordingly, when the VCOs 24 and 25 respectively produce the pulse signals $V_{p1}$ and $V_{p2}$ shown in FIGS. 6(A) and 6(B), a pulse signal $V_{p3}$ shown in FIG. 6(C) is obtained from the NAND circuit 26 as the test signal. The duty ratio of this test signal $V_{p3}$ is varied by varying the periods of the pulse signals $V_{p1}$ and $V_{p2}$.

Figure 5:
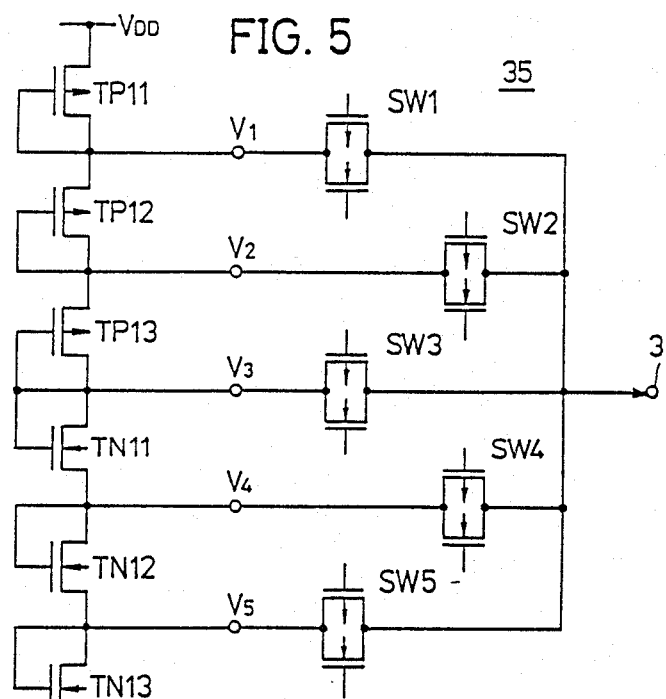
FIG. 5 is a circuit diagram showing an embodiment of a voltage supplying circuit in the circuit system shown in FIG. 3.

Returning now to the description of FIG. 3, a voltage supplying circuit 35 varies the control voltage $V_{DD}$ supplied to the transmission gate TG1. FIG. 5 shows an embodiment of the voltage supplying circuit 35. In FIG. 5, the voltage supplying circuit 35 comprises P-channel transistors TP11, TP12 and TP13, N-channel transistors TN11, TN12 and TN13, and analog switches SW1 through SW5. When it is assumed that the transistors TP11, TP12 and TP13 respectively have threshold voltages VP1, VP2 and VP3 and the transistors TN11, TN12 and TN13 respectively have threshold voltages VN1, VN2 and VN3, voltages at nodes $V_1$ through $V_5$ can be described by the following equations.

$V_1 \approx V_{DD} - VP1$ $V_2 \approx V_1 - VP2$ $V_3 \approx V_2 - VP3$ $V_4 \approx V_3 - VN1$ $V_5 \approx V_4 - VN2$ Accordingly, by applying appropriate control signals to terminals $37_{1a}$ through $37_{5b}$ shown in FIG. 3, it is possible to appropriately control the ON and OFF states of the analog switches SW1 through SW5 and obtain the control voltage $V_{DD}$ having a desired voltage.

Figure 7:
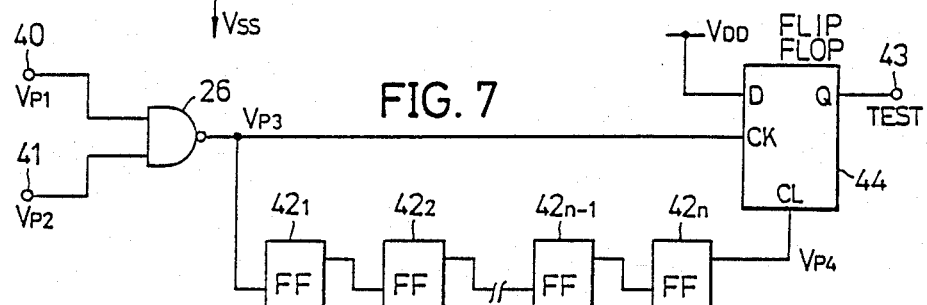
FIG. 7 is a circuit diagram showing a modification of an essential part of the test signal generating circuit.

FIG. 7 shows a modification of an essential part of the test signal generating circuit 12. The modification of the test signal generating circuit 12 comprises n toggle flip-flops $42_1$ through $42_n$ which are connected in series and a delay flip-flop 44 in addition to the elements shown in FIG. 3. The output pulse signals $V_{p1}$ and $V_{p2}$ of the VCOs 24 and 25 are applied to terminals 40 and 41, respectively. The output pulse signal $V_{p3}$ of the NAND circuit 26 is supplied to a clock terminal CK of the flip-flop 44 and to a data terminal of the flip-flop $42_1$. An output pulse signal $V_{p4}$ of the flip-flop $42_n$ is applied to a clear terminal CL of the flip-flop 44. The control voltage $V_{DD}$ is supplied to a data terminal D of the flip-flop 44, and a test signal TEST is obtained through a terminal 43.

When the pulse signals $V_{p1}$ and $V_{p2}$ shown in FIGS. 6(A) and 6(B) are respectively applied to the terminals 40 and 41, the pulse signal $V_{p3}$ is outputted from the NAND circuit 26. Hence, the flip-flop 44 enters a high-level signal ($V_{DD}$) responsive to a rising edge of the pulse signal $V_{p3}$, and the level of the test signal TEST becomes high as shown in FIG. 6(E). On the other hand, the flip-flop 44 is cleared by the pulse signal $V_{p4}$ shown in FIG. 6(D) after n pulses of the pulse signal $V_{p3}$, and the level of the test signal TEST becomes low. In FIG. 6(E), W denotes the pulse width of the test signal TEST corresponding to the n pulses of the pulse signal $V_{p3}$. Therefore, according to the present modification, it is possible to fix the level of the test signal TEST for a predetermined time interval.

The present invention is not limited to the embodiments described heretofore, and two or more test circuits may be provided in the vicinity of the logic circuit.

In this case, it is possible to more accurately detect the defects in the logic circuit of the LSI.

In addition, the circuit construction of the test signal generating circuit 12 is not limited to that of the embodiments, and depending on the test items, the frequency of the test signal may be fixed.

Further, the present invention is not limited to these embodiments, but various variations and modifications may be made without departing from the scope of the present invention.

What is claimed is:

1. A semiconductor device operating in first and second modes, said device comprising:
    an external input terminal for receiving an external input signal;
    an external output terminal;
    a test signal generating means for generating a test signal having an arbitrary frequency;
    a switching signal generating means for generating a switching signal and inputting said switching signal to said test signal generating means;
    a logic circuit means for processing said external input signal in said second mode;
    at least one test circuit means for detecting a defect of said logic circuit means indirectly, said test circuit means having a predetermined circuit structure;
    a first buffer means, having a first input terminal connected to said external input terminal for receiving said external input signal, a second input terminal connected to said test signal generating means for receiving said test signal, a first output terminal connected to said logic circuit means, and a second output terminal connected to said test circuit means, said first buffer means receiving said switching signal for supplying said test signal to said test circuit means in said first mode and for supplying said external input signal to said logic circuit means in said second mode, in response to said received switching signal; and
    a second buffer means connected to said test circuit means, said logic circuit means, and said external output terminal, said second buffer means receiving said switching signal for supplying an output of said test circuit means to said external output terminal in said first mode and for supplying an output of said logic circuit means to said external output terminal in said second mode, in response to said received switching signal.

2. A semiconductor device as claimed in claim 1 wherein said test circuit means is located in a vicinity of said logic circuit means.

3. A semiconductor device as claimed in claim 1 in which said first buffer means comprises a buffer amplifier, first gate means provided in an input stage of said buffer amplifier for selectively supplying to said buffer amplifier said test signal from said test signal generating means in said first mode and said external input signal from said external input terminal in said second mode responsive to said switching signals, and second gate means provided in an output stage of said buffer amplifier for selectively supplying an output signal of said buffer amplifier to said test circuit means in said first mode and to said logic circuit means in said second mode.

4. A semiconductor device as claimed in claim 1 in which said second buffer means comprises a buffer amplifier, and gate means provided in an input stage of said buffer amplifier for selectively supplying to said external output terminal the test signal received through said test circuit means in said first mode and the output signal of said logic circuit means in said second mode.

5. A semiconductor device as claimed in claim 1 in which said test signal generating means comprises first and second voltage controlled oscillators supplied with a control voltage, and a NAND circuit supplied with output signals of said first and second voltage controlled oscillators for producing said test signal, said first and second voltage controlled oscillators having mutually different input control voltage versus output oscillation frequency characteristics.

6. A semiconductor device as claimed in claim 5 which further comprises a voltage supply circuit for supplying said control voltage to said first and second voltage controlled oscillators.

7. A semiconductor device as claimed in claim 6 in which said voltage supply circuit supplies a variable control voltage to variably control the frequency of said test signal.

* * * * *